United States Patent
Le et al.

(10) Patent No.: US 6,535,424 B2
(45) Date of Patent: Mar. 18, 2003

(54) VOLTAGE BOOST CIRCUIT USING SUPPLY VOLTAGE DETECTION TO COMPENSATE FOR SUPPLY VOLTAGE VARIATIONS IN READ MODE VOLTAGE

(75) Inventors: Binh Q. Le, San Jose, CA (US); Masaru Yano, Kodaira (JP); Santosh K. Yachareni, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/915,018

(22) Filed: Jul. 25, 2001

(65) Prior Publication Data

US 2003/0021152 A1 Jan. 30, 2003

(51) Int. Cl.$^7$ .............................................. G11C 16/04
(52) U.S. Cl. ............................ 365/185.18; 365/185.23; 365/189.11
(58) Field of Search ...................... 365/185.18, 185.23, 365/185.01, 189.11, 189.01

(56) References Cited

U.S. PATENT DOCUMENTS

| | | | |
|---|---|---|---|
| 5,510,749 A | * 4/1996 | Arimoto | 327/170 |
| 5,726,944 A | 3/1998 | Pelley, III et al. | |
| 5,729,172 A | * 3/1998 | Tsukada | 307/110 |
| 5,973,546 A | 10/1999 | Le et al. | |
| 6,212,107 B1 | * 4/2001 | Tsukada | 327/536 |
| 6,236,581 B1 | 5/2001 | Foss et al. | |
| 6,259,635 B1 | 7/2001 | Khouri et al. | |

FOREIGN PATENT DOCUMENTS

EP 0 766 256 A1 4/1997

OTHER PUBLICATIONS

US 5,612,921, 3/1997, Chang et al. (withdrawn)
See p. 1 of IDS.

\* cited by examiner

*Primary Examiner*—Hoai Ho
(74) *Attorney, Agent, or Firm*—Eschweiler & Associates, LLC

(57) ABSTRACT

Flash memory array systems and methods are disclosed for producing a supply regulated boost voltage, wherein the application of a supply voltage to a supply voltage level detection circuit (e.g., analog to digital converter, digital thermometer) which is used to generating one or more supply voltage level detection signals from measurement of the supply voltage level applied to the voltage boost circuit, which may be used as a boosted wordline voltage for the read mode operations of programmed memory cells, and wherein the supply voltage level detection signals are applied to a boosted voltage compensation circuit to generate one or more boosted voltage compensation signals which are applied to a voltage boost circuit operable to generate a regulated boosted voltage for a flash memory array of programmed core cells. Thus, a fast compensation means is disclosed for the $V_{CC}$ power supply variations typically reflected in the output of the boost voltage circuit supplied to the word line of the flash memory array, thereby generating wordline voltages during the read mode which are substantially independent of variations in the supply voltage.

14 Claims, 10 Drawing Sheets

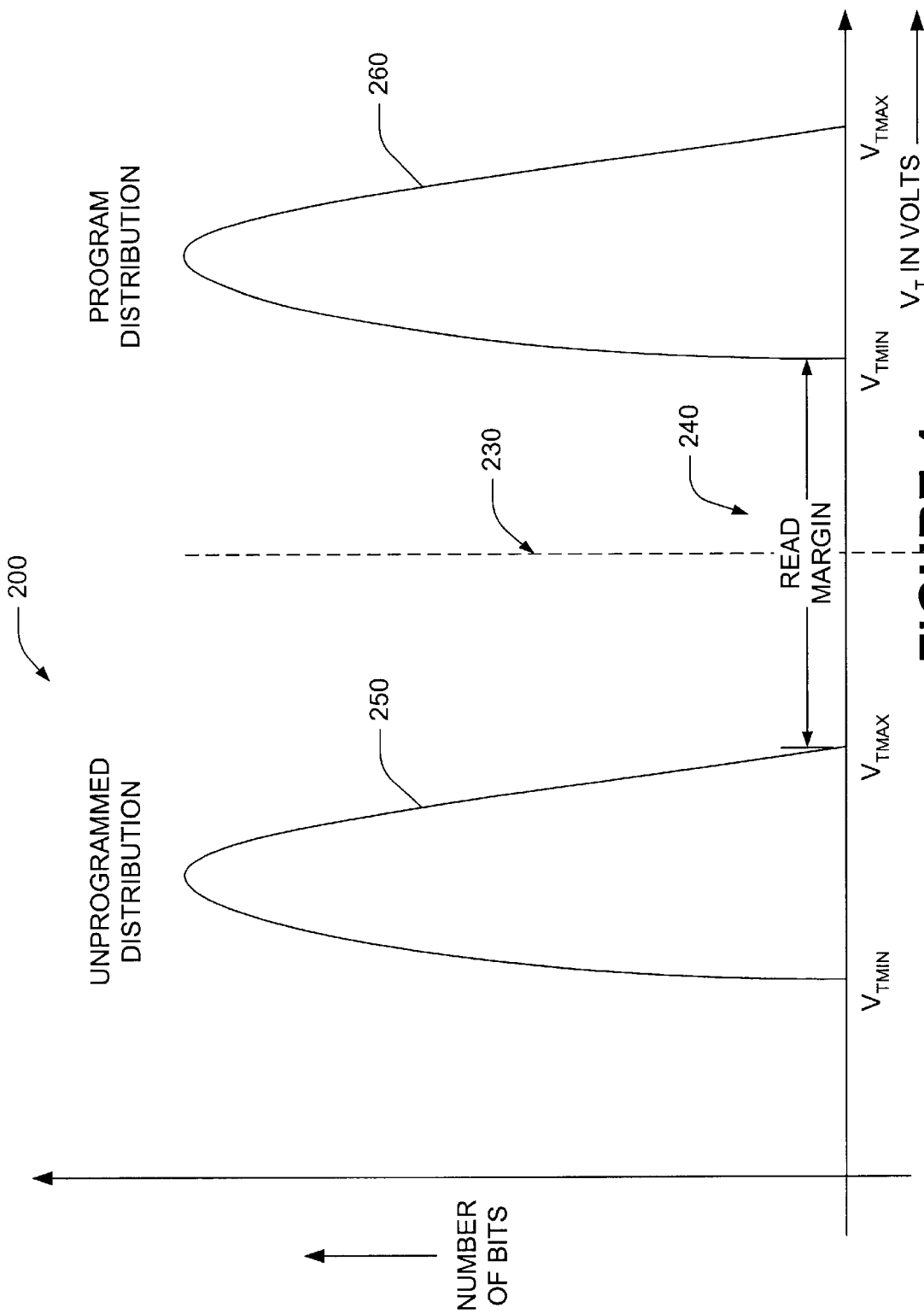

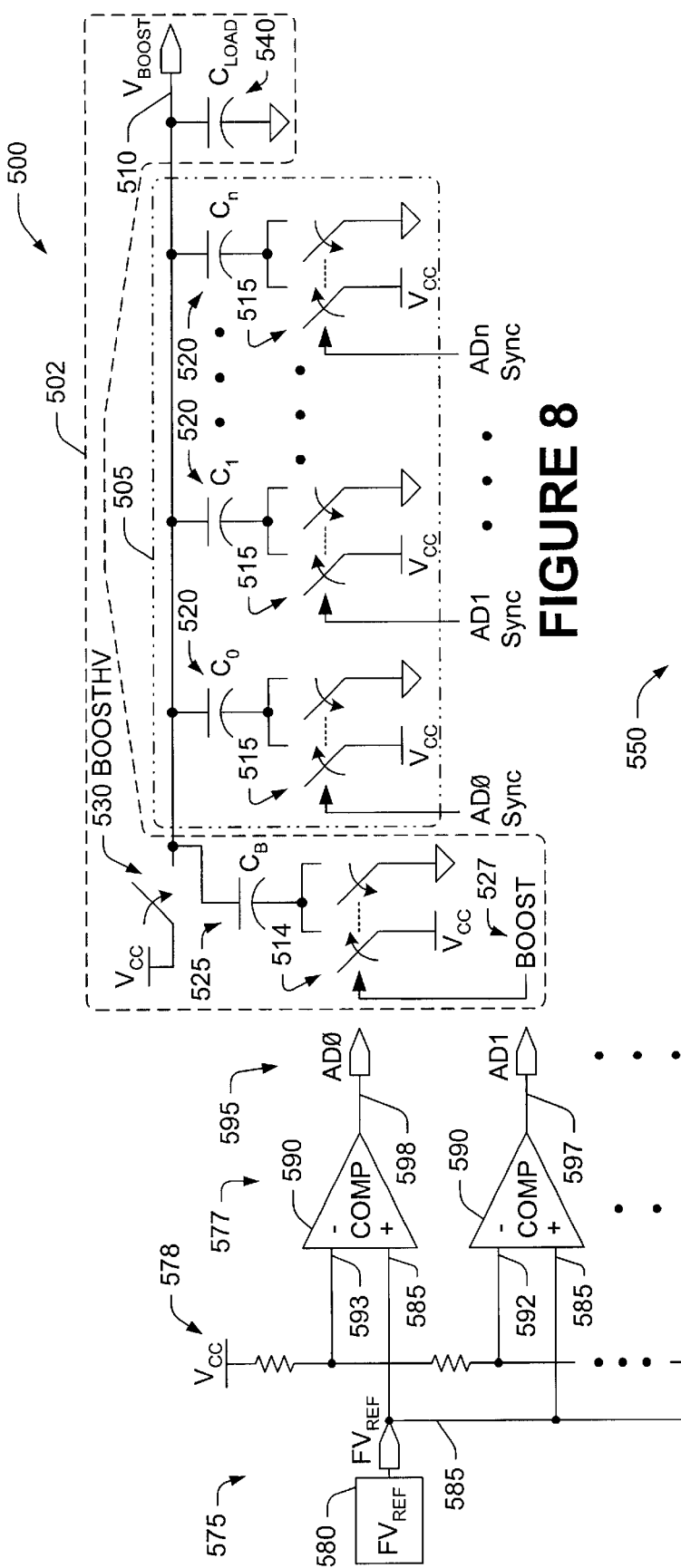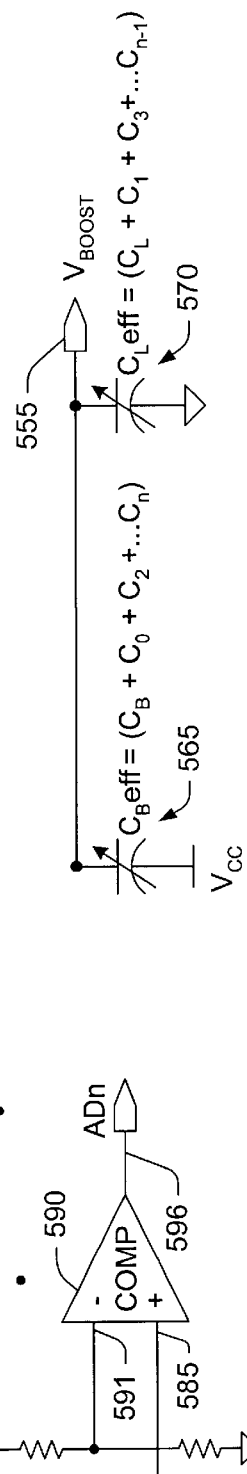

VOLTAGE BOOST CIRCUIT USING SUPPLY VOLTAGE DETECTION TO COMPENSATE FOR SUPPLY VOLTAGE VARIATIONS IN READ MODE VOLTAGE

FIELD OF INVENTION

The present invention relates generally to memory systems and in particular, to flash memory array systems and methods for producing a voltage boost circuit, wherein a voltage detection circuit (e.g., analog to digital converter, digital thermometer), may be used to measure the $V_{CC}$ applied to the voltage boost circuit, along with boost compensation circuitry to regulate the boost voltage output from inherent reflected $V_{CC}$ variations. The boost voltage may be applied to a wordline for read mode operations of memory cells.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry, whereby such operations may be performed on the cells within a specific byte or word. The individual memory cells are typically comprised of a semiconductor structure adapted for storing a bit of data. For instance, many conventional memory cells include a metal oxide semiconductor (MOS) device, such as a transistor in which a binary piece of information may be retained. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell MOS device. In an erase or program operation the voltages are applied so as to cause a charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a type of electronic memory media which can be rewritten and hold its content without power. Flash memory devices generally have life spans from 100K to 1MEG write cycles. Unlike dynamic random access memory (DRAM) and static random access memory (SRAM) memory chips, in which a single byte can be erased, flash memory is typically erased in fixed multi-bit blocks or sectors. Conventional flash memories are constructed in a cell structure wherein a single bit of information is stored in each flash memory cell. In such single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cells in a typical NOR configuration. In addition, the drain regions of the cells are connected together by a conductive bitline. The channel of the cell conducts current between the source and the drain in accordance with an electric field developed in the channel by the stacked gate structure. In the NOR configuration, each drain terminal of the transistors within a single column is connected to the same bitline. In addition, each flash cell associated with a given bit line has its stacked gate terminal coupled to a different wordline, while all the flash cells in the array have their source terminals coupled to a common source terminal. In operation, individual flash cells are addressed via the respective bitline and wordline using peripheral decoder and control circuitry for programming (writing), reading or erasing functions.

Such a single bit stacked gate flash memory cell is programmed by applying a relatively high voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 0.5 and 1.0 volts in a read operation. A voltage is then applied to the gate (e.g., the wordline) of the memory cell transistor in order to cause a current to flow from the drain to source. The read operation gate voltage is typically applied at a level between a programmed threshold voltage (VT) and an unprogrammed threshold voltage. The resulting current is measured, by which a determination is made as to the data value stored in the cell.

More recently, dual bit flash memory cells have been introduced, which allow the storage of two bits of information in a single memory cell. The bitline voltage required to read dual bit memory cells is typically higher than that of single bit, stacked gate architecture memory cells, due to the physical construction of the dual bit cell. For example, some dual bit memory cell architectures require between 1.5 and 2.0 volts to properly bias the bitline or drain of such cells in a read operation. Because the voltage applied to the bitline or drain of the memory cell is derived from the memory device supply voltage ($V_{CC}$), the ability to provide the higher bitline voltage required to read the newer dual bit memory cells may be impaired when the supply voltage is at or near lower rated levels. In addition, low power applications for memory devices, such as cellular telephones, laptop computers, and the like, may further reduce the supply voltage available.

In a prior art flash memory device, boosted voltage circuits apply a boosted wordline voltage for the read mode operations of memory cells. $V_{CC}$ variations are typically reflected in the output of the boost voltage circuit which is supplied to the word line of the flash memory array, during a read operation. Such variations in wordline voltages from the boost circuit degrades the ability in the read mode circuitry to discriminate accurately whether or not a cell is programmed. Accordingly, there is a need for a means of compensation for the variations in the $V_{CC}$ supply applied to the boosted voltage circuit, and for fast boost voltage regulation.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its sole purpose is to present some concepts of the invention in a simplified form as a prelude to the more detailed description that is presented later.

In the present invention of flash memory array systems and methods for producing a voltage boost circuit, the application of a voltage detection circuit (e.g., analog to digital converter, digital thermometer) may be used to measure the value of $V_{CC}$ applied to a voltage boost circuit which may be used to generate a boosted word line voltage for the read mode operations of memory cells. $V_{CC}$ variations are typically reflected in the output of the boost voltage circuit which is supplied to the wordline of the flash memory array. By compensating for the variations in the $V_{CC}$ supply applied to the voltage boost circuit, the boost voltage is regulated, thereby enabling a more consistent read voltage on the wordline.

According to one aspect of the present invention, a voltage value associated with the $V_{CC}$ supply voltage is ascertained, for example, using an A/D converter. The determined voltage value is then used to compensate or otherwise adjust a voltage boost circuit. For example, a digital word representing the $V_{CC}$ voltage value is used to vary effective capacitance values within the voltage boost circuit, thereby resulting in an output boost voltage that is substantially independent of variations in $V_{CC}$. Consequently, the present invention provides a generally constant boost voltage, for example, a boosted wordline voltage, which facilitates an accurate reading of flash memory cells despite fluctuations in the $V_{CC}$.

The aspects of the invention find application in devices which include dual bit memory cells requiring higher bitline read voltages than single bit cells, and in association with memory devices employed in varying supply voltage applications.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 4 is a distribution plot illustrating a programmed cell threshold voltage distribution and an unprogrammed cell threshold voltage distribution of a number of core cells of an exemplary prior art flash memory array, and a typical read margin between the distribution plots;

FIG. 5b is a simplified timing diagram illustrating exemplary read mode timings and output of the voltage booster of FIG. 5a;

FIG. 7 is a schematic illustration of an exemplary supply voltage level detection circuit, in accordance with an aspect of the invention;

FIG. 8 is a schematic illustration of an exemplary voltage boost compensation circuit in accordance with another aspect of the invention;

FIG. 9 is a schematic illustration of an equivalent circuit of an exemplary voltage booster circuit in accordance with one aspect of the invention.

DETAILED DESCRIPTION OF THE INVENTION

Figure 1:
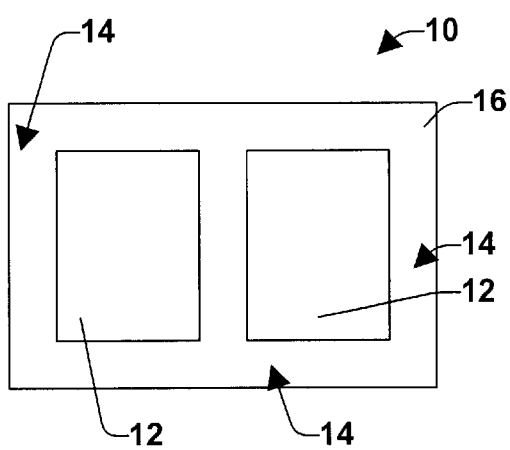
FIG. 1 is a plan view schematically illustrating an exemplary layout of a memory device.

The present invention will now be described with reference to the drawings, wherein like reference numerals are used to refer to like elements throughout. The present invention relates to a flash memory array circuit for producing a boosted voltage which is substantially independent of $V_{CC}$ fluctuations, and which may be used as a boosted wordline voltage for the read mode operations of memory cells. The invention comprises a voltage boost circuit which provides a boosted voltage which is greater than the supply voltage. The $V_{CC}$ power supply is applied to the voltage boost circuit to supply power for the boost operation. $V_{CC}$ variations which were conventionally reflected in the output of the boost voltage circuit are identified and compensation for such variations are generated to thereby generate wordline voltages during a read mode which are substantially independent of variations in $V_{CC}$.

According to an exemplary aspect of the present invention, the system incorporates a voltage detection circuit (e.g., analog to digital converter, digital thermometer), which is used to measure the $V_{CC}$ applied to the voltage boost circuit. The detected $V_{CC}$ value is then employed in a compensation circuit to vary in a manner in which the boost circuit output voltage is generated. By compensating for these variations in the $V_{CC}$ supply which is applied to the voltage boost circuit, the boost voltage can be regulated, enabling a more stable wordline read voltage. This allows proper read operations with respect to the memory cell of interest in the flash memory, even where the supply voltage varies.

Another notable feature of the present invention relates to the elimination of the slow response time typical of voltage regulation circuits. Feedback, or other types of regulation response delays are of major concern in memory devices where word line rise times under about 20 ns are desired. The inventors of the present invention have devised a method of compensation; this design technique has an advantage of eliminating the cycle of: waiting for the regulation circuit elements to respond to their own outputs, feeding these outputs back to their input circuit elements, waiting for another output, then attempting to correct for subsequent outputs and inputs in an iterative fashion.

In the exemplary compensation methodology of the present invention, the supply voltage detection circuit (e.g., analog to digital converter, digital thermometer) is used to measure the supply voltage $V_{CC}$, and output a quantity of "n" comparison results relative to a reference voltage $FV_{REF}$. Each comparison result yields an amount of compensation correction to the boost voltage circuit via the boost voltage compensation circuit. Thus, no feedback time is required in this method. When the $V_{CC}$ sample is taken and a certain number of comparison outputs are turned on, a corresponding number of boost capacitors are added to the boost circuit in relation to the value of the $V_{CC}$. The amount of compensation provided to the boost circuit output $V_{BOOST}$ is therefore regulated to the $V_{CC}$ in an iterative fashion based on the number of voltage detection and compensation elements desired. The resolution of the compensation desired may be adjusted to fit the specific requirements of the boosted voltage usage, for example, by increasing the A/D converter from an 8 bit to a 16 bit A/D converter.

In another aspect of the invention, the voltage detection elements themselves, may also be weighted (e.g., evenly, binarly, exponentially), or weighted in any other suitable fashion across the range of voltage detection, along with a weighting of their respective boost compensation circuit capacitors as may be desired.

Figure 2:
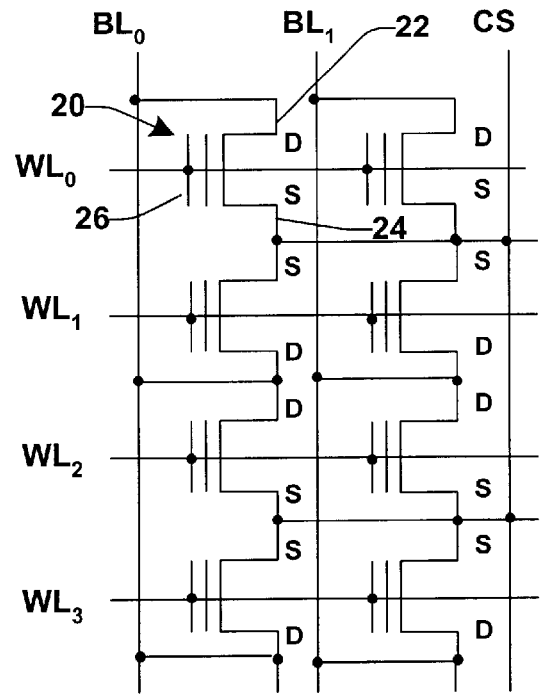
FIG. 2 is a schematic diagram illustrating an exemplary core portion of a memory circuit.

Referring initially to prior art FIGS. 1 and 2, semiconductor memory devices typically include multiple individual components formed on or within a substrate. Such devices often comprise a high density section and a low density section. For example, as illustrated in prior art FIG. 1, a memory device such as a flash memory 10 comprises one or more high density core regions 12 and a low density peripheral portion 14 on a single substrate 16. The high density core regions 12 typically include at least one M×N array of individually addressable, substantially identical memory cells and the low density peripheral portion 14 typically includes input/output (I/O) circuitry and circuitry for selectively addressing the individual cells (such as decoders for connecting the source, gate and drain of selected cells to predetermined voltages or impedances to enable designated operations of the cell such as programming, reading or erasing).

The memory cells within the core portion 12 are coupled together in a circuit configuration, such as a NOR configuration illustrated in FIG. 2. Each memory cell 20 has a drain 22, wherein the drains of more than one cell are connected to a common bitline, a source 24, and a stacked gate 26. Each stacked gate 26 is coupled to a wordline ($WL_0$, $WL_1$, . . . , $WL_N$) while each drain 22 is coupled to a bitline ($BL_0$, $BL_1$, . . . , $BL_N$). Lastly, each source 24 is coupled to a common source line CS. Using peripheral decoder and control circuitry (not shown), each memory cell 20 may be addressed for programming, or reading functions, in a fashion known in the art.

Figure 3:
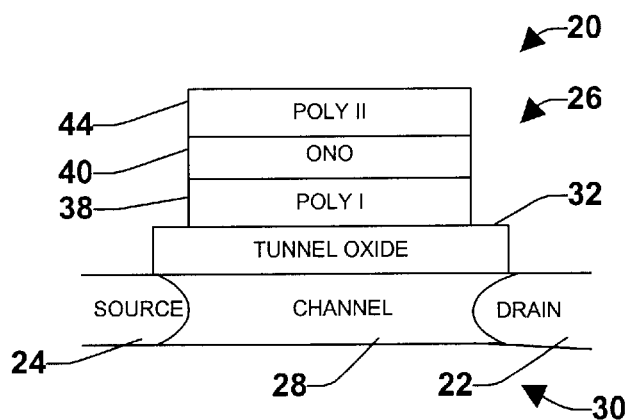
FIG. 3 is a partial cross-sectional view of a conventional stacked gate memory cell.

FIG. 3 provides a cross-sectional illustration of a typical memory cell 20 in the core region 12 of FIGS. 1 and 2. Such a memory cell 20 typically includes the source 24, the drain 22 and a channel 28 in a substrate 30; and the stacked gate structure 26 overlying the channel 28. The stacked gate 26 includes a thin gate dielectric layer 32 (commonly referred to as the tunnel oxide) formed on the surface of the substrate 30. The tunnel oxide layer 32 coats a portion of the top surface of the silicon substrate 30 and serves to support an array of different layers directly over the channel 28. The stacked gate 26 includes a lower most or first film layer 38, such as doped polycrystalline silicon (polysilicon or poly I) layer which serves as a floating gate 38 that overlies the tunnel oxide 32. Note that the various portions of the transistor 20 highlighted above are not drawn to scale in FIG. 3, but rather are illustrated as such for ease of illustration and to facilitate an understanding of the device operation.

Above the poly I layer 38 is an interpoly dielectric layer 40. The interpoly dielectric layer 40 is often a multilayer insulator such as an oxide-nitride-oxide (ONO) layer having two oxide layers sandwiching a nitride layer, or in the an alternative can be another dielectric layer such as tantalum pentoxide. Finally, the stacked gate 26 includes an upper or second polysilicon layer (poly II) 44 which serves as a polysilicon control gate overlying the ONO layer 40. The control gates 44 of the respective cells 20 that are formed in a given row share a common wordline (WL) associated with the row of cells (see, e.g., FIG. 2). In addition, as highlighted above, the drain regions 22 of the respective cells in a vertical column are connected together by a conductive bitline (BL). The channel 28 of the cell 20 conducts current between the source 24 and the drain 22 in accordance with an electric field developed in the channel 28 by the stacked gate structure 26.

The memory cell 20 is programmed by applying a relatively high gate voltage $V_G$ to the control gate 38 and a moderately high drain voltage $V_D$ to the drain 22 in order to produce "hot" (high energy) electrons in the channel 28 near the drain 22. The hot electrons accelerate across the tunnel oxide 32 and into the floating gate 34, which become trapped in the floating gate 38 because the floating gate 38 is surrounded by insulators (the interpoly dielectric 40 and the tunnel oxide 32). As a result of the trapped electrons, a threshold voltage ($V_T$) of the memory cell 20 increases. This change in the threshold voltage (and thereby the channel conductance) of the memory cell 20 created by the trapped electrons is what causes the memory cell 20 to be programmed.

To read the memory cell 20, a predetermined gate voltage greater than the threshold voltage of an unprogrammed memory cell, but less than the threshold voltage of a programmed memory cell, is applied to the control gate 44. If the memory cell 20 conducts (e.g., a sensed current in the cell exceeds a minimum value), then the memory cell 20 has not been programmed (the memory cell 20 is therefore at a first logic state, e.g., a one "1"). Conversely, if the memory cell 20 does not conduct (e.g., the current through the cell does not exceed a threshold value), then the memory cell 20 has been programmed (the memory cell 20 is therefore at a second logic state, e.g., a zero "0"). Thus, each memory cell 20 may be read in order to determine whether it has been programmed (and therefore identify the logic state of the data in the memory cell 20).

In order to erase the memory cell 20, a relatively high source voltage $V_S$ is applied to the source 24 and the control gate 44 is held at a negative potential ($V_G$<0 volts), while the drain 22 is allowed to float. Under these conditions, a strong electric field is developed across the tunnel oxide 32 between the floating gate 38 and the source region 24. The electrons that are trapped in the floating gate 38 flow toward and cluster at the portion of the floating gate 38 overlying the source region 24 and are extracted from the floating gate 38 and into the source region 22 by way of tunneling through the tunnel oxide 32. Consequently, as the electrons are removed from the floating gate 38, the memory cell 20 is erased.

It is thus seen that appropriate voltages must be applied to the various terminals (e.g., source, drain, and gate) of the cells 20 in the memory device 10 in order to perform various operations (e.g., program, erase, read) associated with the device 10. However, as stated above, the applied voltages have heretofore been derived from the source voltage to which the device 10 is connected. Where such a supply voltage is not high enough to supply the voltages required to perform such operations, however, the device 10 may be rendered inoperative or inapplicable in certain systems. This condition may result in low power applications of the memory device 10, for instance, in portable device applications wherein the supply voltage may be low. Alternatively, the memory cells in a memory device may comprise dual bit architectures requiring higher bitline voltages at the drain of the individual cells in order to properly perform read operations. Thus, a voltage boosting circuit is needed to boost the bitline voltage in conditions where the supply voltage is insufficient to allow proper read operations. Also, as the $V_{CC}$ supply voltage changes over time, with temperature, or with the application of various loads, the boost voltage will reflect the $V_{CC}$ changes. The present invention overcomes or minimizes these problems by providing a voltage boost, and compensation for the reflected $V_{CC}$ variations in the voltage boost circuit, enabling a wordline boost voltage which is substantially independent of $V_{CC}$ variations, thus providing more reliability in read operations.

FIG. 4 illustrates the need for a widely separated distribution 200 of unprogrammed 250 and programmed 260 cell threshold voltages. In the read mode operation, a read mode wordline voltage 230 is selected somewhere midway within the read margin 240. This wordline voltage 230 is then applied to the specified wordline to see whether or not the flash cell of interest is conducting and thus provide a determination as to whether the cell threshold is above the word line voltage and therefore the cell is programmed, or below the wordline voltage, and therefore the cell is unprogrammed.

If the boosted wordline voltage that is applied to a cell for this analysis is subject to variations with the $V_{CC}$ supply, then the determination as to whether or not the cell is programmed will also be subject to uncertainty, because the wordline voltage may exit the read margin 240 of FIG. 4. Adding additional uncertainty to the cell read mode determination, the reference voltages applied to the boosted voltage boost circuit voltage will also, as discussed above, reflect some function of the $V_{CC}$ supply variations. Accordingly, an additional aspect of the current invention provides for the regulation, or compensation of the reference, and boost voltages.

Figure 5A:
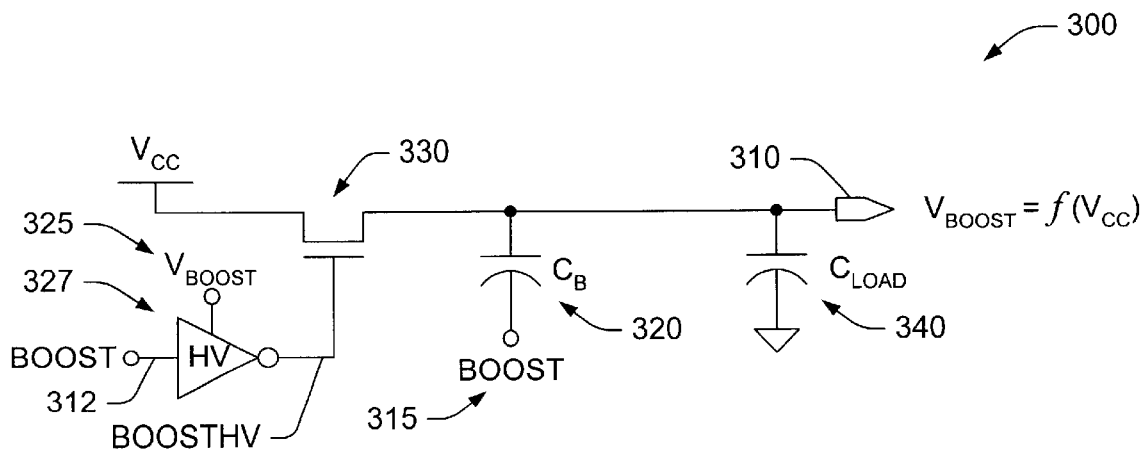
FIG. 5a is a simplified schematic illustration of an exemplary prior art voltage booster circuit for reading a memory cell.

FIGS. 5a illustrates a prior art voltage booster circuit 300 for feeding the wordline in a memory cell read operation. During an ATD time period 360, a boost signal 312 goes low, and a BOOSTHV signal which is generated with a high voltage inverter 327, goes high. A $V_{BOOST}$ potential 325 on the high voltage inverter 327 causes saturated conduction of an n-mos transistor 330, for example, whereby the $V_{CC}$ conducts substantially through transistor 330 to precharge the boost capacitor $C_B$ at 320 and load capacitor $C_L$ at 340 to $V_{CC}$ while the BOOST terminal 315 is held at ground. At the end of the ATD time period, the BOOST signal 312 commands the transistor 330 to turn-off by going high, and the BOOST terminal 315 is switched from ground to $V_{CC}$. Therefore, the charge voltage on the boost capacitor is now added to the $V_{CC}$ voltage to force a charge sharing between $C_B$ and $C_L$ such that a new voltage is generated at the $V_{BOOST}$ terminal 310 which is greater than $V_{CC}$ but less than twice $V_{CC}$. The actual $V_{BOOST}$ terminal 310 voltage can be calculated as follows:

From: Q=CV therefore; $Q_B = C_B V_{CC}$ and $Q_L = C_L V_{CC}$ after $V_{BOOST}$ has settled, the total charge will be:

$Q_{TOTAL}(\text{final}) = Q_{TOTAL}(\text{initial})$ $Q_{TOTAL}(\text{final}) = (V_{BOOST} - V_{CC})C_B + V_{BOOST}C_L$ therefore:

$(V_{BOOST} - V_{CC})C_B + V_{BOOST}C_L = (C_B + C_L)V_{CC}$ solving for $V_{BOOST}$: $V_{BOOST} = ((2C_B + C_L)/(C_B + C_L))V_{CC}$
as a simple example, where $C_B = C_L = C$, we have:
$V_{BOOST} = (3C/2C)V_{CC}$
$V_{BOOST} = (3/2)V_{CC}$ Intuitively, then, we prove that $V_{BOOST}$ would result in a voltage mid-way between $V_{CC}$ and $2V_{CC}$ for the prior art voltage booster. Note, however, that $V_{BOOST}$ is a function of $V_{CC}$ as well as the values of $C_B$ and $C_L$. Therefore, as $V_{CC}$ varies, the boost voltage output $V_{BOOST}$ will also vary. As discussed above, such variations in $V_{BOOST}$ are undesirable since they can lead to read errors.

Figure 5B:
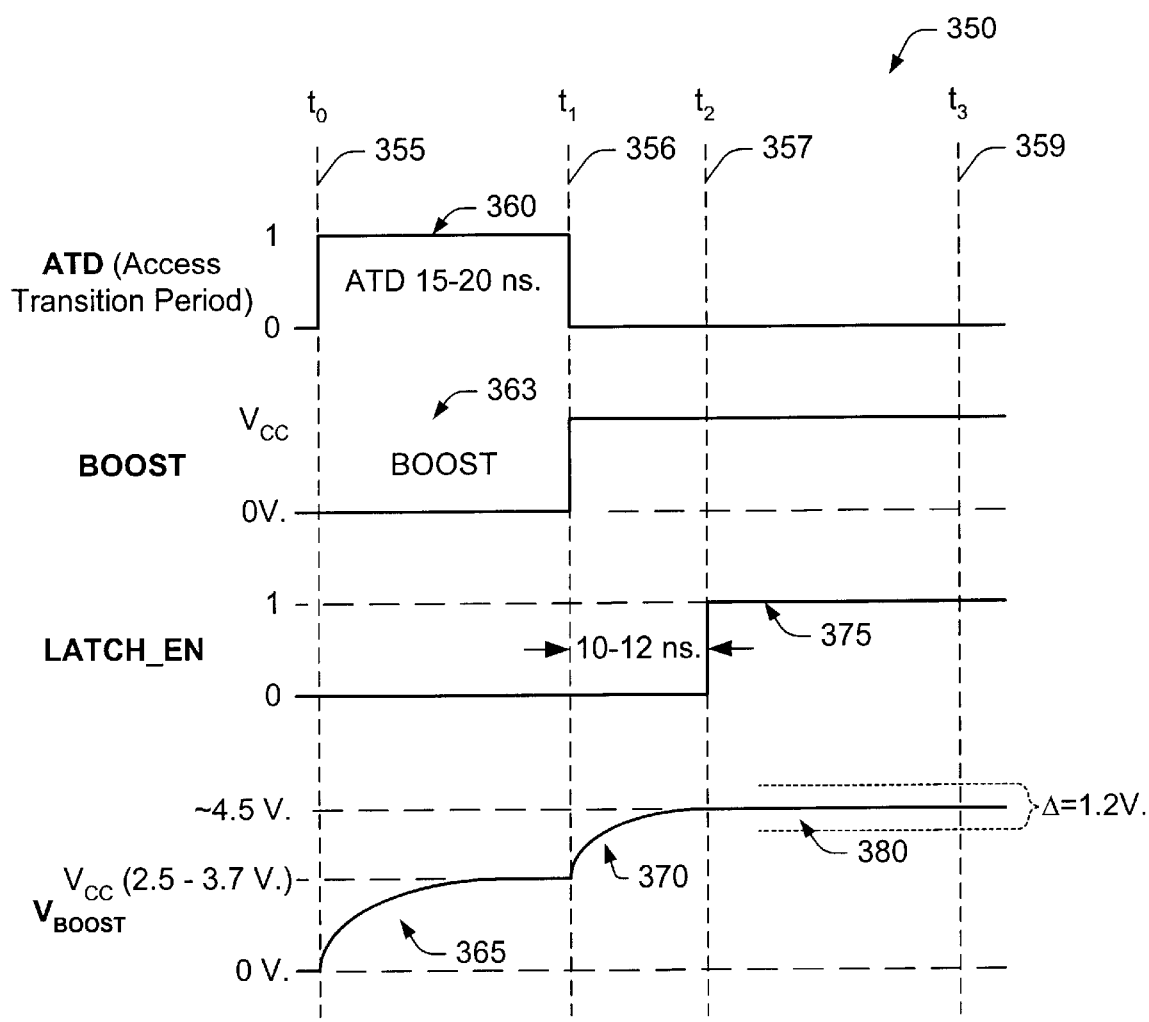

FIG. 5b demonstrates an exemplary timing diagram 350 for the read mode timings and output of the exemplary voltage booster of FIG. 5a. Portions of the timing diagram of FIG. 5b will be used to describe the operation of the prior art FIG. 5a, and other portions of the timing diagram of FIG. 5b will be used as a reference to explain the operations of an exemplary system of FIGS. 6 and following, according to the invention.

At time $t_0$ (355) of FIG. 5b, the Access Transition Period ATD 360, goes high for about 15 to 20 ns during which time a precharge of the grounded boost capacitor 320 and load capacitor $C_L$ (340) takes place from about 0 volts to about $V_{CC}$, shown along the $V_{BOOST}$ charge curve 365. At time $t_1$ (356), ATD goes low again, while BOOST terminals 312 and 315 are switched to $V_{CC}$, and forces boost capacitor $C_B$ (320) to share its charge plus the $V_{CC}$ supply voltage with load capacitor $C_L$ (340) so that both $C_B$ & $C_L$ charge share from $V_{CC}$ to approximately 4.5 volts, shown along the $V_{BOOST}$ charge curve 370. As the supply voltage $V_{CC}$ may vary by about 1.2 volts, $V_{BOOST}$ will also vary by about 1.2 volts, as shown at 380, making $V_{BOOST}$ at 310 a function of $V_{CC}$ as symbolized at 310. The LATCH_EN timing 375 will be discussed in more detail later in conjunction with the A/D functions of the present invention, wherein the outputs of various comparators will be latched to ensure a stable output voltage. The LATCH_EN timing 375 begins, for example, at time $t_2$ (357), about 10 ns to 12 ns after $t_1$, and lasts through the $t_3$ at 359 until the end of the boost operation, wherein the $V_{CC}$ measurement data present on the A/D converter is latched to the output of the A/D converter.

Figure 6:
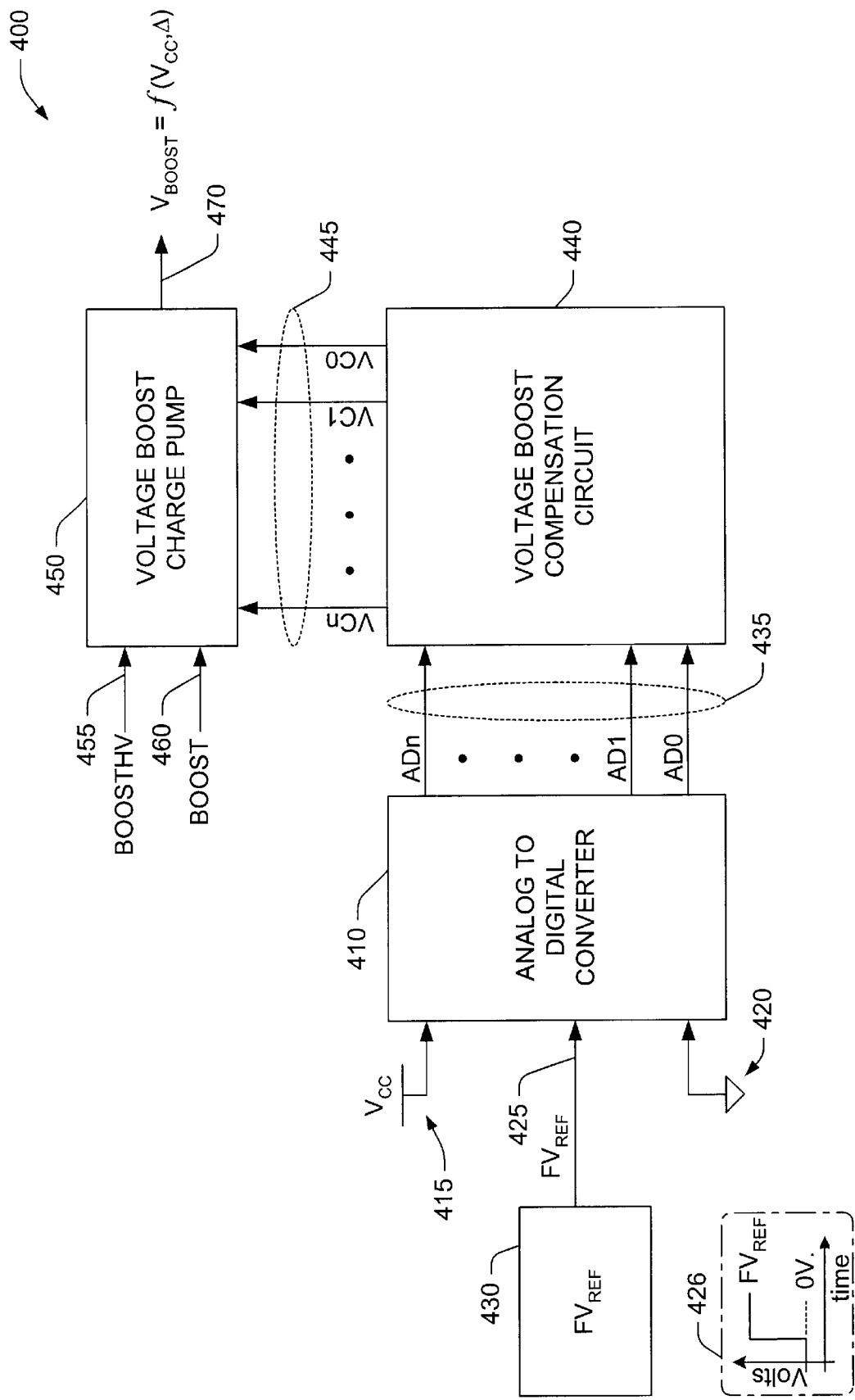
FIG. 6 is a system level functional block diagram illustrating an exemplary regulated voltage booster system in which various aspects of the invention may be carried out.

FIG. 6 is a system level functional block diagram illustrating an exemplary regulated voltage booster system 400 in which various aspects of the invention may be carried out. The regulated voltage booster system 400 takes $V_{CC}$ 415 and ground 420 into an analog to digital converter (A/D) 410, to sample and measure the level of the supply voltage, for example, by comparing a reference voltage $FV_{REF}$ 425 output from an independent band-gap reference voltage circuit 430, switched on at time $t_0$ as shown in waveform 426, to one or more target supply levels set by the supply voltage $V_{CC}$. The A/D 410 outputs one or more voltage level detection signals 435 (which reflect the determined value of $V_{CC}$) to a voltage boost compensation circuit 440 which generates compensation (e.g., by switching one or more boost compensation capacitor terminals to either $V_{CC}$ or ground depending on the supply level detected relative to a target supply level set by the reference voltage 425). The voltage boost circuit 450, during the ATD time period, uses timing mode signal BOOSTHV 455, and the compensation data from circuit 440 to vary an amount of boost to thereby generate an output voltage $V_{BOOST}$ which is substantially independent of variations in $V_{CC}$. For example, circuit 450 may couple the boost compensation capacitors in parallel with either a boost capacitor, or a load capacitor thereof. In the above exemplary manner, the $V_{BOOST}$ output 470 of the voltage boost circuit 450 has been boosted to the final target level.

Since speed is a high priority during the read operations, the inventors have also taken advantage of the ATD signal timing interval of the present invention, to detect the $V_{CC}$ using the A/D converter, so that time is not wasted separately measuring the $V_{CC}$ and charging the compensation capacitors. The ATD timing is therefore used to charge the boost capacitors and load capacitors, and is also used to detect the value of $V_{CC}$.

FIG. 7 is a schematic diagram illustrating an exemplary supply voltage level detection circuit 575 (e.g., analog to digital converter, digital thermometer), which may correspond to circuit 410 of FIG. 6 in accordance with an aspect of the invention. In circuit 575, the $V_{CC}$ supply voltage level is sampled and measured relative to a reference level set by the reference voltage $FV_{REF}$ 585 output from a reference voltage circuit 580 (e.g., a band-gap reference circuit of about 1.2 volts). The supply voltage may be compared by comparators 590 to the reference voltage $FV_{REF}$ 585, in as many individual partitions (or bits), as is necessary to achieve the desired resolution shown by an n bit A/D converter 575 and discrete outputs 595 AD0 through and (596, 597, 598). In the simplified schematic diagram 575, a sample of the $V_{CC}$ is applied thru a voltage divider to the inverting inputs of the comparators 590, and the reference voltage $FV_{REF}$ 585 is applied to the noninverting inputs, however, numerous techniques of biasing, and dividing the supply voltage may be obvious, to otherwise produce one or more outputs from the voltage detection circuit 575 which may be used to ascertain the value associated with $V_{CC}$ and any such alternative detection circuits are contemplated as falling within the scope of the present invention. During the LATCH_EN timing 375 of FIG. 5b, which begins at time $t_2$ at 357, the $V_{CC}$ measurement data present, on the A/D converter is latched to the output of the A/D converter, thereby enabling (e.g., latching at a time when A/D output data is stable) a set of compensation capacitors 520 of FIG. 8. In FIG. 7, the latching mechanism is resident within the various comparators 590, however, as will be illustrated later, such latching functionality may be employed as a subsequent, discrete circuit, as may be desired.

FIG. 8 is a simplified schematic illustration of an exemplary voltage boost compensation circuit 500 in accordance with another aspect of the invention which may correspond to circuit 440 of FIG. 6. The $V_{BOOST}$ compensated output 510 is a function of the original boost circuit components comprised of the boost capacitor $C_B$ 525, and the load capacitor $C_L$ 540, and is supplemented with the boost compensation circuitry 505. The boost compensation circuitry 505 takes its inputs from the AD0 thru ADn sync inputs from the voltage detection circuit 575 of FIG. 7. As a compensation capacitor 520 is selected, by the corresponding A/D Sync input from the stable latched A/D output, the compensation circuit 505 is operable to switch the boost compensation capacitor 520 between $V_{CC}$ and ground depending on the supply level detected relative to a reference level set by the reference voltage $V_{REF}$ 585. When the ATD time period BOOSTHV switch 530 closes, the $V_{CC}$ voltage precharges the load capacitor $C_L$ 540, and the boost capacitor $C_B$ 525, which is switched to ground by the BOOST terminal 527, along with the selected boost compensation capacitors $C_{0\ldots n}$ 520, which are also grounded by the selection 515, and the load capacitor $C_L$ 540, which is held at ground. At the end of the ATD time period, the BOOSTHV switch 530 opens and the BOOST terminal 527 of the boost capacitor $C_B$ 525 is switched back to $V_{CC}$, along with the selected boost compensation capacitors $C_{0\ldots n}$ 520 (based on the detected level of $V_{CC}$), which are also now switched to $V_{CC}$ by the selection 515. At this point, if these precharge capacitors were not connected to the load capacitors, $V_{BOOST}$ would be elevated to $2V_{CC}$, however, load capacitor $C_L$ 540, is still held at ground, and the nonselected compensation capacitors of 520 are now switched to ground. This forces all the precharge stored in $C_B$, and the selected $C_{0\ldots n}$ capacitors to charge share among all the capacitors on the $V_{BOOST}$ output 510 bringing the boosted voltage to the final target level.

FIG. 9 is a schematic illustration of an equivalent circuit of an exemplary voltage booster 550 in accordance with one aspect of the invention, and as described in FIG. 8 for circuit 500. $C_B$eff is the effective total boost capacitance 565 as seen by the boost circuit 550, comprising $C_B$, plus all the voltage detector selected capacitors $C_0+\ldots C_n$. $C_L$eff is the effective total load capacitance 570, comprising $C_L$, plus all the voltage detector nonselected capacitors $C_1+\ldots C_{n+1}$. as seen by the boost circuit 550 and impressed on the $V_{BOOST}$ 555 output line. Therefore the effective boost capacitance $C_B$eff and effective load capacitance $C_L$eff is a function of $V_{CC}$. Note that FIG. 9 illustrates a set of arbitrary examples for $C_B$eff and $C_L$eff.

Therefore, the effective $V_{BOOST}$ terminal voltage 555 of FIG. 9 for one arbitrary example of the present invention becomes:

From: $V_{BOOST}=((2C_B+C_L)/(C_B+C_L))V_{CC}$
We have: $V_{BOOST}=((2C_B\text{eff}+C_{Leff})/(C_B\text{eff}+C_{Leff}))V_{CC}$
where: $C_B\text{eff}=C_B+C_0+\ldots C_n$ (of selected comp. capacitors)
and where: $C_L\text{eff}=C_L+C_1+\ldots C_{n-1}$ (of nonselected comp. capacitors)

It should be noted, that the total number of capacitors used in this exemplary method remains constant.

Figure 10:
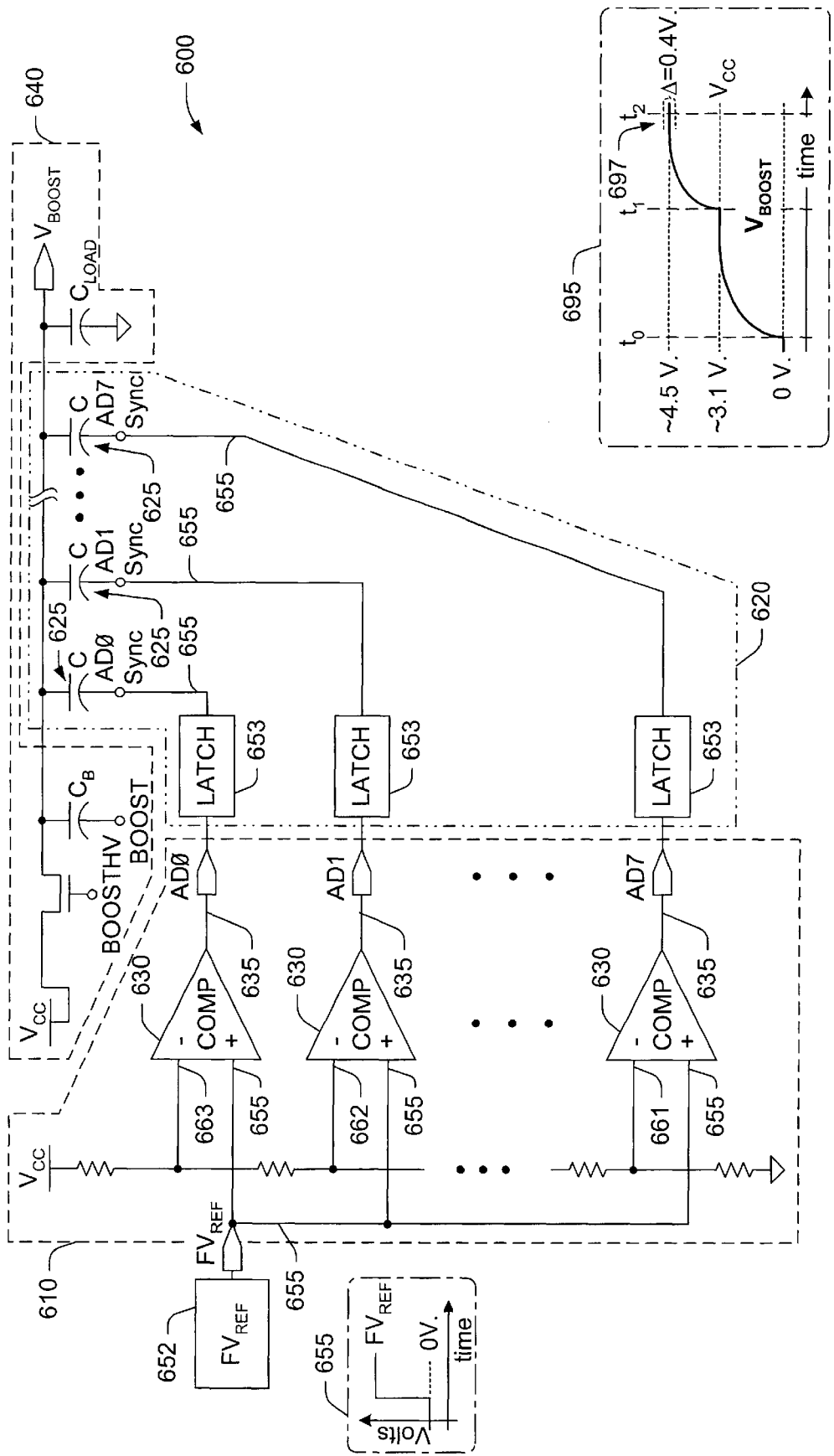
FIG. 10 is a simplified schematic illustration of an exemplary regulated voltage booster system using an A/D circuit for supply voltage compensation, in accordance with an aspect of the invention.

FIG. 10 is a schematic illustration of an exemplary regulated voltage booster system 600 using an A/D circuit 610 for supply voltage compensation, in accordance with an aspect of the invention. This exemplary system, comprises an eight bit A/D converter for the voltage detection circuit 610 which uses comparators 630 to detect the supply voltage level by comparing voltages to a reference voltage $FV_{REF}$ output 655 from a reference voltage supply circuit 652. The system 600 also comprises a boost compensation circuit 620 comprising, for example, eight (8) latch circuits 653 which are operable to latch the output of each respective comparator circuit 630 in accordance with a predetermined timing for output voltage stability purposes. The output of each of the latch circuits 653 selectively drive a corresponding boost compensation capacitor 625, for example, for coupling select boost compensation capacitors 625 in parallel with the boost capacitor $C_B$ or the load capacitor $C_L$, respectively. The system 600 further includes a voltage boost circuit 640 comprising a boost capacitor $C_B$, BOOSTHV precharge transistor, and $C_L$ load capacitor (e.g., the capacitance of the word line). The input reference voltage waveform 655 illustrates that the reference voltage may be turned on with the ATD mode timing. The output $V_{BOOST}$ waveform 695 illustrates the precharge curve between $t_0$ and $t_1$ and the charge sharing charge curve between times $t_1$ and $t_2$. In the final analysis, the inventors have found that in one exemplary method, given a $V_{CC}$ supply voltage change of about 1.2 volts, that an 8 bit, evenly weighted compensation provides a $V_{BOOST}$ 695 regulation response improvement to about 0.4 volts at 697, thus making $V_{BOOST}$ substantially less dependent on $V_{CC}$.

The exemplary system 600 of FIG. 10 operates in the following manner. A plurality of different voltages (661, 662, and 663) which are a function of $V_{CC}$ are each input to a comparator circuit 630 that also receives the reference voltage $FV_{REF}$. Thus the outputs 635 of the comparators form a digital word (e.g., 00011111) that reflect the value of $V_{CC}$ and the digital word is latched, for example, via the latch circuits 653 in accordance with the LATCH_EN signal of FIG. 5b. This digital word serves as a $V_{CC}$ level determination and each bit of the word drives their respective capacitors, as illustrated in FIG. 10. Therefore, based on the digital word, a unique combination of capacitors 625 are electrically placed in parallel with either $C_B$ or $C_L$, respectively, thereby altering the values associated with $C_B$eff and $C_L$eff. Therefore, the values of $V_{CC}$ will be employed as compensation to vary $C_B$eff and $C_L$eff in order to make $V_{BOOST}$ substantially independent of variations in $V_{CC}$. As noted before, the $V_{CC}$ measurement data present on the A/D converter is latched to the output 635 of the AID converter 630 during the LATCH_EN timing (375 of FIG. 5b), to synchronize (coincide) with the selection of a set of compensation capacitors 625 of the compensation circuit 620 which reflects the digital word.

Figure 11:
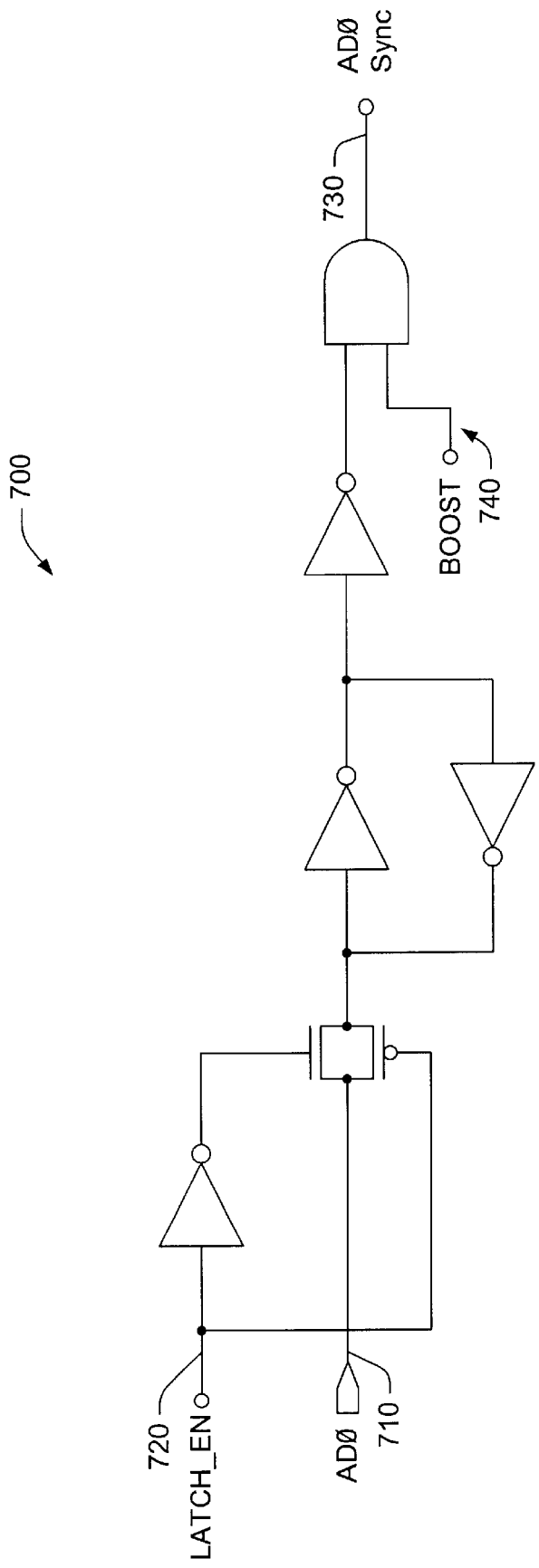
FIG. 11 is a schematic diagram illustrating an exemplary latch circuit according to the present invention.

In accordance with one exemplary aspect of the present invention, the latch circuits 653 of FIG. 10 may be employed as a circuit illustrated in FIG. 11, and designated at reference numeral 700. The latch circuit 700 is enabled via the LATCH_EN signal 720 to pass the data value (e.g., AD0) which is then transmitted to its respective capacitor terminal 730 based on the transition of a boost signal 740. By using a boost signal 740, for example, for each latch circuit the data values are not output to the capacitors during the ATD timing. Although one exemplary latch circuit 700 is illustrated in FIG. 11, it should be understood that other latching mechanisms, circuits and systems may be employed, if desired, and such alternatives are contemplated as falling within the scope of the present invention.

Figure 12:
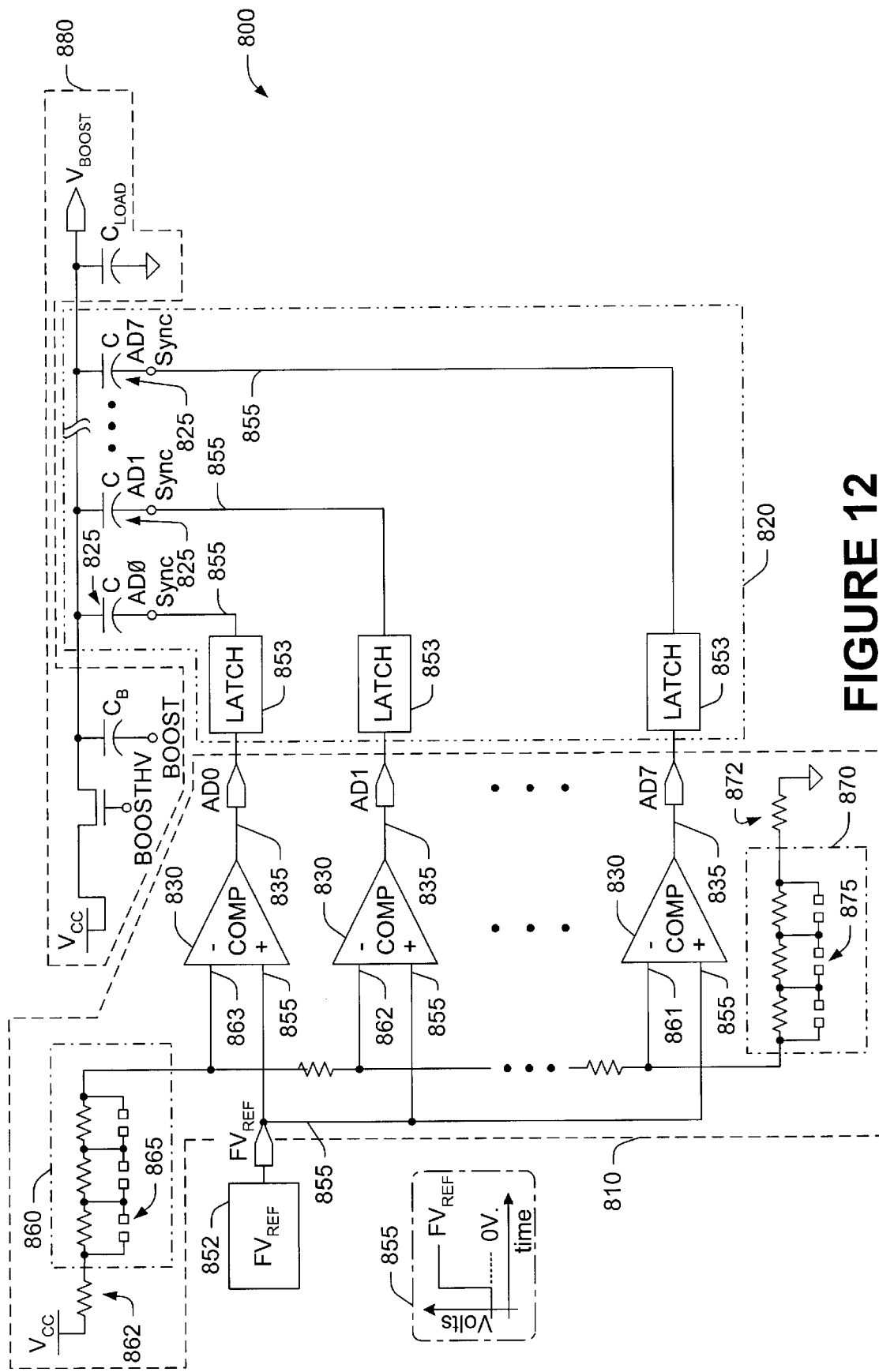
FIG. 12 is a simplified schematic illustration of an exemplary regulated voltage booster system using an A/D circuit for supply voltage compensation, together with two sets of exemplary resistor metal options for trimming the divider chain, in accordance with an aspect of the invention.

FIG. 12 is another schematic illustration of an exemplary regulated voltage booster system 800 using an A/D circuit 810 for supply voltage compensation, in accordance with an aspect of the invention. This exemplary circuit is similar to the circuit of FIG. 10 except for the addition of two sets of metal options resistor circuits 860 and 870, which provide for selective trimming of the span, and offset of the resistor divider chain which biases the comparator circuits 830 of the A/D 810. The metal options resistor circuits provide for trimming and matching of the band-gap reference voltage circuit 852 and an expected output $FV_{REF}$ 855 to the desired switching voltages of the comparator circuits 830 of the A/D 810.

In accordance with another aspect of the present invention, the resistor ladder network employed in the $V_{CC}$ detect circuits 610 and 810 of FIGS. 10 and 12, respectively, may be designed to further compensate for variations of the reference voltage $FV_{REF}$ with respect to $V_{CC}$. As discussed supra, $FV_{REF}$ is a reference voltage that may be generated, for example, via a bandgap reference type circuit. Accordingly, $FV_{REF}$ is not absolutely constant, but instead is a value that varies slightly with respect to variations in the supply voltage $V_{CC}$. For example, it has been found in one exemplary bandgap reference circuit that the target reference voltage of 1.2V actually varies between about 1.15V and about 1.25V for variations in $V_{CC}$ between about 2.6V and 3.5V, respectively. As may be appreciated, if $FV_{REF}$ varies with respect to $V_{CC}$, the digital word provided at the comparator outputs (e.g., AD0–AD7) may not accurately reflect the true value of $V_{CC}$ as desired.

Therefore according to one aspect of the present invention, resistance values for the resistor ladder or network are selected that compensate for variations in $FV_{REF}$ due to $V_{CC}$ variations in order to accurately determine the actual $V_{CC}$ value. Such compensation is accomplished in the following exemplary manner. Initially, an acceptable bias current in the resistor ladder network is selected, for example, 300 µA at $V_{CC}$=3V. Therefore, using V=IR, the total resistance R of the resistor network can be determined to be R=(3V)/(300 µA)=10KΩ. An identification is made that the first comparator must switch at a specified value of $V_{CC}$ (for example, 2.65V). Then, using a characterization of the bandgap reference circuit (used to generate $FV_{REF}$), it is determined that the value of $F_{REF}$ at $V_{CC}$=2.65V is 1.15V. Therefore using the above values, one can determine the appropriate resistance values necessary within the resistor ladder network to satisfy the above criteria.

Figure 13:
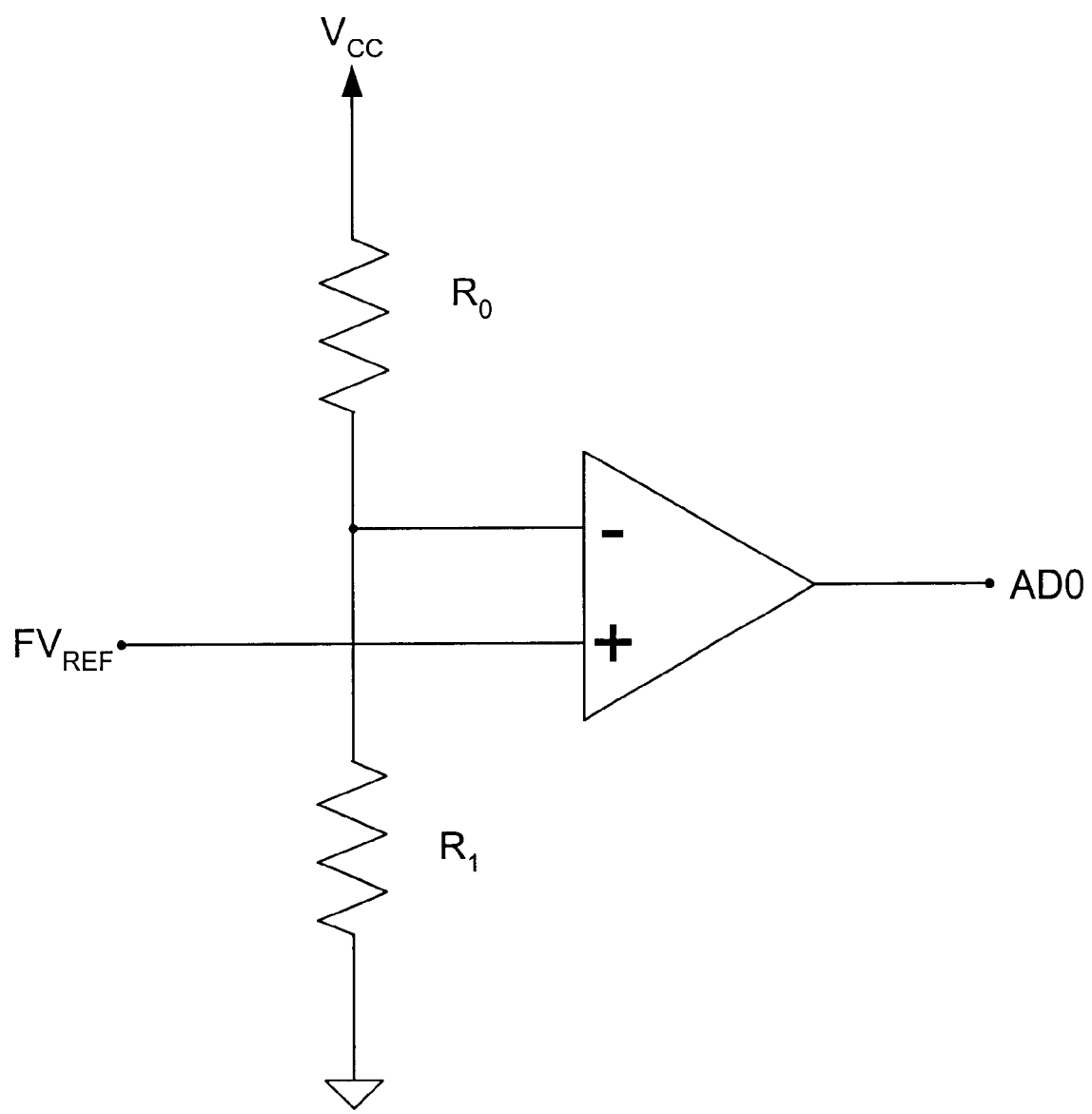
FIG. 13 is a schematic diagram illustrating an exemplary comparator with collective network resistances in a voltage divider relationship according to the present invention.

Therefore, for the particular comparator above (e.g., comparator 630 of FIG. 10 associated with AD0) needs to trip when $V_{CC}$ is at 2.65V, for example, and it is known that $FV_{REF}$ will be 1.15V when $V_{CC}$ is 2.65V, a voltage divider circuit is evaluated as illustrated in FIG. 13, wherein $R_0+R_1$ is the total resistance of the resistor network, $R_0$ represents the sum total of resistances above the particular comparator, and $R_1$ is the sum of the resistances below the comparator of interest. Using the voltage divider principle, it is known that:

$$[R_1/(R_0+R_1)]V_{CC}=FV_{REF}, \text{ and}$$

substituting the known values of $R_0+R_1$=10K Ω, $V_{CC}$=2.65V, and $FV_{REF}$=1.15V (for this particular example), one can solve for $R_1$, and then for $R_0$.

$$[R_1/10K\Omega](2.65V)=1.15V, R_1 \approx 4.34K\ \Omega,$$

and thus $R_0 \approx 5.66$ KΩ.

Similarly, a next comparator, for example, should switch at $V_{CC}$=2.8V, and with a VCC of 2.8V, $FV_{REF}$ will have a unique value associated therewith. Using such values, we can repeat the above analysis for the next comparator node, and subsequent comparator nodes, as desired, by determining the value at which the selected comparator is to trip, and knowing how $FV_{REF}$ varies with respect to $V_{CC}$. Thus each of the resistance values in the voltage divider network can be identified in order to ensure that the comparators outputs will accurately reflect the true $V_{CC}$ value despite variations in $FV_{REF}$ due to variations in $V_{CC}$.

Figure 14:
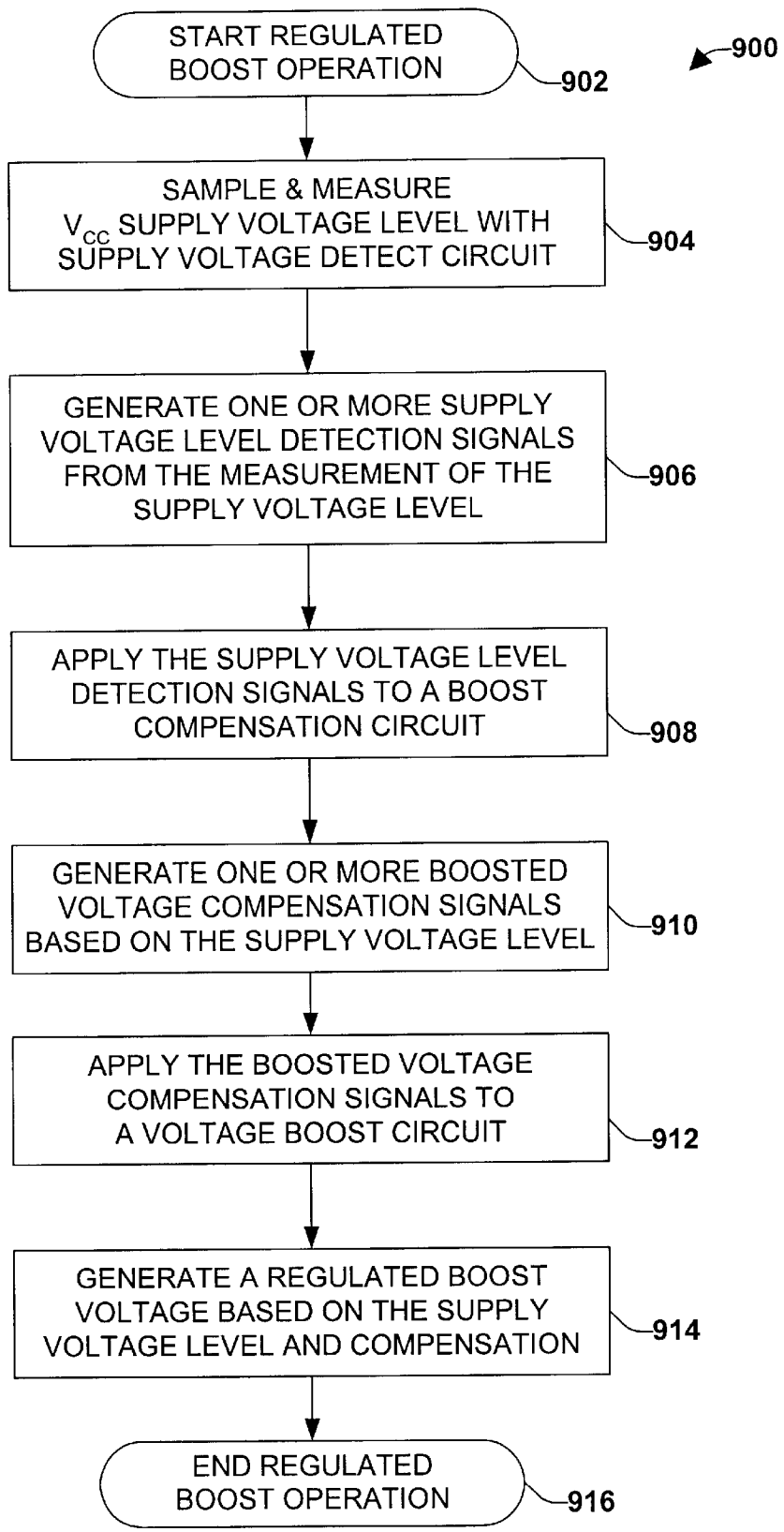
FIG. 14 is a flow diagram illustrating an exemplary method for a regulated boost operation in association with an aspect of the present invention.

Another aspect of the invention provides a methodology for regulating the boost operation in a memory device, which may be employed in association with the memory devices illustrated and described herein, as well as with other memory devices. Referring now to FIG. 14, an exemplary method 900 is illustrated for regulating the boost operation in a memory device. While the exemplary method 900 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 900 may be implemented in association with the apparatus and systems illustrated and described herein as well as in association with other systems not illustrated.

The method 900 comprises applying a supply voltage to a voltage level detection circuit, and determining the level difference relative to a target value set by a reference voltage, in order to control one or more capacitors used in a boost voltage compensation circuit corresponding to the supply error, and to correct for the supply level error reflected in the output of a voltage boost circuit. The regulated boost operation method begins at step 902. At 904 the supply voltage (e.g., $V_{CC}$) is then sampled and measured with a supply voltage detection circuit, (e.g., analog to digital converter, digital thermometer). At 906, the supply voltage level detection circuit generates one or more supply voltage level detection signals (e.g., 435 associated in FIG. 6 with A/D 410), in response to the Δ $V_{CC}$ compared to a target value set by the reference voltage, in order to apply the supply voltage level detection signals to a boost compensation circuit at 908, wherein the boosted voltage is greater than the supply voltage.

At 910, the boost compensation circuit generates one or more boosted voltage compensation signals (e.g., 445 of FIG. 6 the outputs of 440), which are then applied at 912 to the voltage boost circuit (e.g., 450 of FIG. 6, to the bottom of capacitors 625 of FIG. 10), and thereafter a regulated boost voltage $V_{BOOST}$ resulting from the applied compensation is produced at step 914 in order to ascertain the data value stored in a memory cell. The regulated boost operation thereafter ends at 916, and the method 900 may be repeated for subsequent voltage boost and read operations of the memory device. The methodology 900 thus provides for quick, accurate voltage boosting in a voltage boost circuit which uses an A/D converter to compensate for $V_{CC}$ voltage variations, which may be applied to core cells during read operations of flash memory arrays. Therefore the method 900 generates a $V_{BOOST}$ voltage which is substantially independent of variations in $V_{CC}$. Other variants of methodologies may be provided in accordance with the present invention, whereby compensation or regulation of a boosted voltage is accomplished.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A system for generating a regulated boosted word line voltage for read operations, comprising:
   a supply voltage detection circuit configured to detect a supply voltage value and generate one or more output signals associated therewith;
   a voltage boost circuit operable to receive a supply voltage and generate the boosted word line voltage having a value greater than the supply voltage; and
   a voltage boost compensation circuit operably coupled to the supply voltage detection circuit and the voltage boost circuit, and operable to receive the one or more output signals from the supply voltage detection circuit and alter a capacitive loading associated with the voltage boost circuit based on the one or more output signals, thereby causing the boosted word line voltage to be substantially independent of the supply voltage value.

2. The system of claim 1, wherein the supply voltage detection circuit comprises a level detector circuit operable to compare one of a plurality of voltages associated with the supply voltage value to a reference voltage and generate the one or more output signals.

3. The system of claim 1, wherein the voltage boost circuit further comprises:
   a boost capacitor having a first terminal selectively coupled to the supply voltage through a switch and a second terminal coupled to a boost signal; and
   a load capacitor having a first terminal coupled to the first terminal of the boost capacitor which forms an output of the voltage boost circuit, and a second terminal coupled to a circuit ground potential,
   wherein when the switch is closed, the boost signal is low and the boost capacitor and the load capacitor charge to a voltage value which approximates the supply voltage value, and when the switch is open, the boost signal is at a high level equal to about the supply voltage, and the boost capacitor and the load capacitor experience charge sharing, thereby causing the first terminals thereof to increase to a boost voltage value greater than the supply voltage value, wherein the boost voltage value is a function of the capacitance of the boost capacitor and the load capacitor, respectively.

4. The system of claim 3, wherein the voltage boost compensation circuit comprises:
   a plurality of compensation capacitors each having a first terminal coupled to the first terminals of the boost capacitor and the load capacitor, and each having a second terminal which is selectively coupleable to a circuit ground potential or a voltage potential approximately equal to the supply voltage based on the one or more output signals from the supply voltage detection circuit, thereby causing one or more of the plurality of compensation capacitors to be in parallel with the boost capacitor or the load capacitor, thereby adjusting the capacitive loading of the voltage boost circuit based on the supply voltage value.

5. The system of claim 4, wherein the adjusting of the capacitive loading of the voltage boost circuit alters an effective boost capacitance and an effective load capacitance, thereby resulting in a boosted word line voltage which is substantially independent of variations in the supply voltage.

6. The system of claim 1, wherein the supply voltage detection circuit further comprises a reference voltage circuit operable to provide a reference voltage for comparing one or more voltages associated with the supply voltage value thereto, wherein the comparison of the reference voltage to the one or more voltages associated with the supply voltage value results in the one or more output signals associated with the supply voltage value.

7. A system for generating a regulated boosted word line voltage for read operations, comprising:
   a supply voltage detection circuit configured to detect a supply voltage value and generate one or more output signals associated therewith, wherein the supply voltage detection circuit comprises an analog-to-digital converter operable to receive the supply voltage value as an analog input and generate the one or more output signals, wherein each output signal represents a bit of a multi-bit word reflecting the supply voltage value;
   a voltage boost circuit operable to receive a supply voltage and generate the boosted word line voltage having a value greater than the supply voltage; and
   a voltage boost compensation circuit operably coupled to the supply voltage detection circuit and the voltage boost circuit, and operable to receive the one or more output signals from the supply voltage detection circuit and alter a loading associated with the voltage boost circuit based on the one or more output signals, thereby causing the boosted word line voltage to be substantially independent of the supply voltage value.

8. A system for generating a regulated boosted word line voltage for read operations, comprising:
   a supply voltage detection circuit configured to detect a supply voltage value and generate one or more output signals associated therewith, wherein the supply voltage detection circuit comprises:
      a voltage reference circuit; and
      a plurality of comparator circuits each having a first input coupled to the voltage reference circuit and a second input coupled to one of a plurality of voltages associated with the supply voltage, wherein an output of each of the comparator circuits form an output signal which collectively form a digital word which reflects the supply voltage value;
   a voltage boost circuit operable to receive a supply voltage and generate the boosted word line voltage having a value greater than the supply voltage; and
   a voltage boost compensation circuit operably coupled to the supply voltage detection circuit and the voltage boost circuit, and operable to receive the one or more output signals from the supply voltage detection circuit and alter a loading associated with the voltage boost circuit based on the one or more output signals, thereby causing the boosted word line voltage to be substantially independent of the supply voltage value.

9. A method of generating a word line read voltage in a flash memory device which is substantially independent of variations in a supply voltage, comprising the step of:
   detecting a value of the supply voltage; and
   varying a capacitive loading condition of a voltage boost circuit used to generate the word line read voltage in response to the detected supply voltage value, wherein the capacitive loading condition variation causes the word line read voltage to be substantially independent of variations in the supply voltage.

10. The method of claim 9, wherein varying the capacitive loading condition comprises:
   coupling a first terminal of a plurality of capacitors to a node associated with an output of the voltage boost circuit; and
   coupling a second terminal of one or more of the plurality of capacitors to a circuit ground potential based on the detected supply voltage value.

11. The method of claim 9, wherein varying the capacitive loading condition comprises:
   coupling a first terminal of a plurality of capacitors to a node associated with an output of the voltage boost circuit; and
   coupling a second terminal of one or more of the plurality of capacitors to the supply voltage level based on the detected supply voltage value.

12. The method of claim 9, wherein the voltage boost circuit comprises a boost capacitor having a first terminal coupled to an output node thereof and a second terminal coupled to a boost signal, and wherein the voltage boost circuit further comprises a load capacitor having a first terminal coupled to a circuit ground potential and a second terminal coupled to the output node, wherein varying the capacitive loading condition comprises:

coupling a first terminal of a plurality of compensation capacitors to the output node of the voltage boost circuit;

allowing the boost signal to transition to a level approximately equal to the supply voltage level; and coupling a second terminal of one or more of the plurality of compensation capacitors to the supply voltage level and coupling the second terminal of the rest of the compensation capacitors to the circuit ground potential based on the detected supply voltage value, thereby altering an effective capacitance associated with the boost capacitor and the load capacitor based on the detected supply voltage value.

13. A method of generating a word line read voltage in a flash memory device which is substantially independent of variations in a supply voltage, comprising the step of:

detecting a value of the supply voltage, wherein detecting the supply voltage value comprises:

inputting the supply voltage value into an analog-to-digital converter; and generating a multi-bit digital word which is related to the supply voltage value; and varying a loading condition of a voltage boost circuit used to generate the word line read voltage in response to the detected supply voltage value, wherein the loading condition variation causes the word line read voltage to be substantially independent of variations in the supply voltage.

14. A method of generating a word line read voltage in a flash memory device which is substantially independent of variations in a supply voltage, comprising the step of:

detecting a value of the supply voltage, wherein detecting the supply voltage value comprises:

generating a plurality of voltage values associated with the supply voltage value;

comparing each of the plurality of voltage values to a reference voltage value; and generating a digital output value associated with each of the comparisons, thereby generating a multi-bit digital word and reflecting the supply voltage value; and varying a loading condition of a voltage boost circuit used to generate the word line read voltage in response to the detected supply voltage value, wherein the loading condition variation causes the word line read voltage to be substantially independent of variations in the supply voltage.

* * * * *

UNITED STATES PATENT AND TRADEMARK OFFICE
CERTIFICATE OF CORRECTION

PATENT NO. : 6,535,424 B2
DATED : March 18, 2003
INVENTOR(S) : Binh Q. Le, Masaru Yano and Santosh K. Yachareni It is certified that error appears in the above-identified patent and that said Letters Patent is hereby corrected as shown below:

<u>Title page, Item [54] and Column 1, line 4,</u>
Please insert the letter -- S -- after the last word in the title "VOLTAGE".

<u>Column 3,</u>
Line 5, please replace the formula "(VT)" with the formula -- $(V_T)$ --.

<u>Column 10,</u>
Line 18, please replace the word "and" with the word -- ADn --.

<u>Column 11,</u>
Line 27, please replace the formula "$C_Leff = C_L + C_1 +...C_{n-1}$" with the formula -- $C_Leff = C_L + C_1 + ...C_{n+1}$ --.

Signed and Sealed this

Twenty-ninth Day of July, 2003

JAMES E. ROGAN
*Director of the United States Patent and Trademark Office*